(12) United States Patent
Macias

(10) Patent No.: US 9,845,924 B1
(45) Date of Patent: *Dec. 19, 2017

(54) TUBE LIGHT WITH IMPROVED LED ARRAY

(71) Applicant: Guillermo Macias, Santa Clarita, CA (US)

(72) Inventor: Guillermo Macias, Santa Clarita, CA (US)

(73) Assignee: COLT INTERNATIONAL CLOTHING INC., Santa Clarita, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/450,372

(22) Filed: Mar. 6, 2017

Related U.S. Application Data

(63) Continuation of application No. 13/896,868, filed on May 17, 2013, now Pat. No. 9,719,642.

(60) Provisional application No. 61/648,554, filed on May 17, 2012.

(51) Int. Cl.
| | |
|---|---|
| *F21K 9/278* | (2016.01) |
| *F21K 9/272* | (2016.01) |
| *H05B 33/08* | (2006.01) |
| *F21V 3/02* | (2006.01) |
| *F21V 23/04* | (2006.01) |
| *F21Y 115/10* | (2016.01) |
| *F21Y 103/10* | (2016.01) |
| *F21W 131/406* | (2006.01) |
| *H04N 5/225* | (2006.01) |
| *G03B 15/02* | (2006.01) |

(52) U.S. Cl.
CPC .............. *F21K 9/278* (2016.08); *F21K 9/272* (2016.08); *F21V 3/02* (2013.01); *F21V 23/04* (2013.01); *H05B 33/0845* (2013.01); *F21W 2131/406* (2013.01); *F21Y 2103/10* (2016.08); *F21Y 2115/10* (2016.08); *H04N 5/2256* (2013.01)

(58) Field of Classification Search
CPC ......... F21S 10/023; F21S 10/02; F21K 9/278; F21K 9/272; F21V 23/04; H04N 5/2256
USPC .................................................... 362/11, 231
See application file for complete search history.

(56) References Cited

U.S. PATENT DOCUMENTS

| | | |
|---|---|---|
| 6,720,745 B2 | 4/2004 | Lys et al. |
| 7,180,252 B2 | 2/2007 | Lys et al. |
| 7,476,003 B2 | 1/2009 | Kim |

(Continued)

OTHER PUBLICATIONS amazon.com; Dimmable High Power Par38 White + Blue LED Aquarium Reef Corals Grow Light Bulb; US; May 23, 2012.

*Primary Examiner* — William N Harris
(74) *Attorney, Agent, or Firm* — David L. Hoffman; Hoffman Patent Group

(57) ABSTRACT

Apparatus and system for producing light using LED lighting with output within a predetermined desired color temperature range for commercial lighting uses. A preferred embodiment includes a first and second group of LEDs arranged in an alternating matrix configuration, each group of LEDs configured to produce light in a predetermined color temperature range. In a preferred embodiment, an LED light system includes a tubular LED lamp having substantially the same size and dimensions as a traditional fluorescent lamp tube and a control box for controlling power input and power gain to the first, second, or both groups of LEDs.

40 Claims, 5 Drawing Sheets

(56) References Cited

U.S. PATENT DOCUMENTS

| | | | |
|---|---|---|---|
| 7,646,029 B2 * | 1/2010 | Mueller | F21K 9/00 257/13 |
| 8,203,260 B2 | 6/2012 | Li et al. | |
| 9,057,493 B2 | 6/2015 | Simon et al. | |
| 2003/0072156 A1 | 4/2003 | Pohlert et al. | |
| 2004/0105261 A1 * | 6/2004 | Ducharme | H05B 33/0857 362/231 |
| 2004/0257007 A1 | 12/2004 | Lys et al. | |
| 2007/0228999 A1 * | 10/2007 | Kit | H05B 33/0803 315/291 |
| 2007/0258240 A1 | 11/2007 | Ducharme et al. | |
| 2009/0052204 A1 | 2/2009 | Kawashima et al. | |
| 2009/0109668 A1 | 4/2009 | Isobe | |
| 2010/0102729 A1 * | 4/2010 | Katzir | H05B 33/0803 315/113 |
| 2010/0148673 A1 | 6/2010 | Stewart et al. | |
| 2010/0214779 A1 | 8/2010 | Kao | |
| 2010/0289428 A1 | 11/2010 | Frazier et al. | |
| 2010/0315001 A1 | 12/2010 | Domagala et al. | |
| 2011/0058365 A1 | 3/2011 | Osawa | |
| 2011/0084608 A1 | 4/2011 | Lin et al. | |
| 2011/0163941 A1 | 7/2011 | Li | |
| 2011/0235318 A1 | 9/2011 | Simon et al. | |
| 2011/0285292 A1 | 11/2011 | Mollnow et al. | |

* cited by examiner

TUBE LIGHT WITH IMPROVED LED ARRAY

CROSS REFERENCE TO RELATED APPLICATION

This utility application is a continuation of U.S. patent application Ser. No. 13/896,868, filed May 17, 2013, which claims the benefit of U.S. Provisional Application No. 61/648,554, filed on May 17, 2012 incorporated by reference herein.

BACKGROUND

Field of the Invention

The present invention relates to a lighting system comprising a tube light with an improved LED array capable of producing light within at least two desired predetermined color temperature ranges.

Description of the Related Art

Fluorescent light bulbs or lamps have been used for a long time for various artificial lighting purposes, from residential to commercial lighting. Fluorescent lamps are gas-discharge lamps that use electricity to excite mercury vapor to produce short-wave ultraviolet light that then causes a phosphor to fluoresce, producing visible light. Many fluorescent bulbs are made in tubular form which contains the mercury vapor. As a result, larger fluorescent lamps require large elongated tube lamps to produce the desired amount of light.

While larger fluorescent lamps have been used mostly in commercial buildings or institutional buildings, they also have applications in the lighting industry such as TV, stage, auditorium, and/or film studio use, and/or other venues. However, fluorescent lamps must be used with caution in the lighting industry as the color temperature of fluorescent lamps may create unwanted visual effects for the viewer. Color temperature is a characteristic of visible light measured by the temperature of an ideal black body radiator that radiates light of comparable hue to that of the light source. Color temperature is conventionally stated in the unit of absolute temperature, Kelvin (K). Color temperatures over 5,000 K are considered "cool" colors (blue-ish white), while lower color temperatures of 2,700 to 3,300 are considered "warm" colors (yellowish white through red).

The spectrum of light emitted from a fluorescent lamp is the combination of light directly emitted by mercury vapor, and light emitted by the phosphorescent coating. The spectral lines from the mercury emission and the phosphorescence effect give a combined distribution of light that is different from those produced by incandescent sources. Colored objects are perceived differently under light sources with differing spectral distributions. For example, some people find the color rendition produced by some fluorescent lamps to be harsh and displeasing, sometimes giving a greenish hue to skin tones giving people a sickly or unhealthy appearance. In addition, when used for lighting TV, studio, or film productions, the color temperature of the lighting often may need to be changed in order to match the scene or mood of the production. For example, recreating a scene taking place under sunlight with blue skies may require a color temperature of 9000 to 12000 Kelvin (K), while a scene taking place at sunrise or sunset may require a lighting color temperature of 3200 K. The two most frequently used and desired color temperature ranges in the lighting industry for stage and set lighting have been found to be 3050 to 3300 K for tungsten (warm white), and 5400 to 5600 K for daylight white. These ranges represent ideal color temperature ranges for producing ideal lighting for TV, photography and film studio scenarios.

In such uses where accurate and suitable lighting color temperature is vital, lighting "gels" are often used in conjunction with fluorescent lamps to produce the desired color temperature. These lighting gels often consist of colored tube shaped sleeves made from a semi-transparent material to give the light the desired color effect. Although allowing for modification of the color temperature of light, techniques such as using color gels do not provide an easy method to change the lighting and so cause significant delays in production. For example, if shooting a daytime scene, production workers would need to manually remove and replace all of the colored gels on the fluorescent lamps being used, often a daunting task when faced with several banks of lamps, each bank consisting of numerous individual fluorescent lamps. Or without colored gels, a lighting crew must continually change the fluorescent lamps between daylight white (or day white) colored lamps and tungsten (or warm white) colored lamps, or if desired, other types of white/light colored lamps.

Alternatively, LED (light emitting diode) lighting has been developed and has recently gained popularity. Since LEDs use very little energy and have a relatively long life, in recent years it has been popular to replace existing fluorescent bulbs with LEDs. LEDs present many advantages over incandescent or fluorescent light sources including lower energy consumption, longer lifetime, improved physical robustness, smaller size, and faster switching. There are two primary types of LED lighting used to create white light. One is to use individual LEDs that emit three primary colors (red, green, and blue) and mix the colors to form white light. The other is to use a phosphor material to convert monochromatic light from a blue or ultraviolet LED to broad-spectrum white light, also referred to as phosphor based LEDs.

In order to match the tubular form of a fluorescent bulb, arrays of LEDs may be placed within a tube having the same form factor as a fluorescent lamp, such as a T8 or T12 size fluorescent bulb. One such bulb is made by Dialight and is called DuroSite™. For example, in size T8, the bulb in one form uses SMD LEDs in a four foot long tube and provides 1500 Lumens of Natural White light, using 17 Watts, 300 LEDs, with 90V-277V, and is ETL/UL Approved. However, such existing products cannot provide a lighting solution to create two different predetermined color temperature light outputs suitable for use in the stage lighting industry, for uses such as TV, stage, photography and studio lighting. Sufficient intensity of the light is preferably at least 1000 lux for such an application.

In U.S. Pat. No. 8,203,260 to Li et al discloses an LED light made in a form factor of a fluorescent light and having color temperature which is tunable by blending adjacent pairs of LEDs by dimming one or both LEDs a customized amount to achieve the desired color. The control is complex and the temperature of the cold light is relatively high. The lighting is intended for street lights, vehicle headlights, and/or for other lights subject to moisture, fog, dust or smoke situations. Therefore, a fog or moisture sensor or other sensor is preferably used with the device. Since the drive current to each of the different color LEDs must be reduced to achieve the desired blend of light, the intensity is not only reduced but is expected to vary quite a bit from color to color. There is no single source mode, and the light output is not suitable for studio use.

What is desired is a lighting solution suitable for the lighting industry implementing the advantages of LED lights which allows for evenly dispersed light controllable within specific color temperature parameters without the need to physically switch out colored gels or lamp modules to achieve the desired color temperature light. It is also desirable to maintain the shape and interface of a traditional fluorescent lamp so as to allow maximum usability in the lighting industry without requiring expensive and time consuming equipment overhaul and upgrades.

SUMMARY OF THE INVENTION

Exemplary embodiments of the invention include apparatus and system for producing light using LED lighting with outputs of two predetermined desired color temperatures. In a preferred embodiment, an LED light system includes a tubular LED lamp having substantially the same physical form as a traditional fluorescent lamp tube. The term "LED lamp" or "bulb" as used herein refers to a unitary light module construction utilizing LEDs with a physical shape and form the same as or substantially similar to a traditional fluorescent lamp tube.

A preferred embodiment further includes a plurality of LEDs arranged in a matrix formation on a surface provided within the LED lamp. The term "LEDs", as used herein refers to a single light source utilizing LED lighting technology, including a single LED unit, as well as a single grouping consisting of trichromatic LED units configured and arranged to work together to produce a single color (for example, a grouping of red, green, and blue LED bulbs configured to create white light.)

In the preferred embodiment, the LEDs may be arranged in arrays of four bulbs or lamps preferably in a tube in one direction perpendicular to a main axis of the tube and facing in one direction, by many rows of such LEDs, e.g., at least four rows (for a total of sixteen LEDs). A preferred embodiment may include at least ten or twenty rows of LED arrays, or even twenty-five or more rows (equaling 100 or more LEDs). The number of rows may vary depending on the size of the LED lamp used for the lighting fixture. For example, in a three foot long tube there will be fewer LEDs than a four foot long tube light device, in a linear variance given the same diameter and number of LEDs in each LED array.

A preferred embodiment has a mixture of at least two types of LEDs interspersed in one matrix arrangement. A first type of LED may be configured to produce light in a first predetermined color temperature range, and a second type of LED may be configured to produce light in a second predetermined color temperature range. In the preferred embodiment, the first predetermined color temperature range extends between 5400 and 5600 K for rendering daylight color temperature, and the second predetermined color temperature range extends between 3050 and 3300 K for rendering tungsten color temperature light. The color ranges may be predetermined based on the desirable appearance of a person's skin during commercial video or image recording.

The first and second types of LEDs are preferably arranged within the matrix in a checkerboard pattern, a row of LEDs alternating between the first type and the second type of LEDs. Another preferred embodiment may include various other uniform arrangements having dispersed and/or arrayed patterns of the two types of LEDs within the matrix. In all embodiments, the arrangements of the two types of LEDs are predetermined such that the grouping of the first type of LEDs and the grouping of the second type of LEDs each provide an evenly dispersed light. Maximum driving current to each of the first type of LED, when the LED bulb is on (all first type of LEDs are lit), is preferably the same or substantially the same as driving current to each second type of LED when the second type of bulb is on (all second type of LEDs are lit).

Preferably the intensity output is at least about 1000 lumens. A preferred embodiment may also include a first driver and a second driver for providing driving currents to trigger the first and second types of LED bulbs respectively. The system may also include a controller connected to the at least two drivers for generating a plurality of output signals and outputting the output signals to the drivers in response to a predetermined setting by the user. In another embodiment, there are multiple lamps for stage or set lighting. In a further embodiment, there is a control unit for selectively turning on and off the lamps and, preferably, for selectively dimming and for selecting between the first and second type of LEDs, e.g., daylight white light and tungsten (warm white light).

Because the lamps are LEDs, no ballast is needed.

DESCRIPTION OF EXEMPLARY EMBODIMENTS

In general, various embodiments of the invention relate to LED lighting systems configured to produce at least two different ranges of color temperature light, utilizing a first type of LED bulbs configured to provide a first color temperature range light and a second type of LED bulbs configured to provide a second color temperature range light. The invention is contemplated to be used in conjunction with lighting fixtures and infrastructure traditionally used in conjunction with fluorescent light tube lamps. Additionally, exemplary embodiments of the invention include a controller and a control interface box through which an operator is able to control the output signal output to the drivers of the LEDs. Alternatively, the LED lamp may include a switch determining the grouping of LEDs powered by the voltage, controllable by the user via the control interface box. In yet another embodiment, the user may be able to dim the output signal to the first type of LEDs and second type of LEDs. Preferably, the first type of LEDs are daylight white and the second type of LEDs are tungsten or warm white light.

Figure 1A:
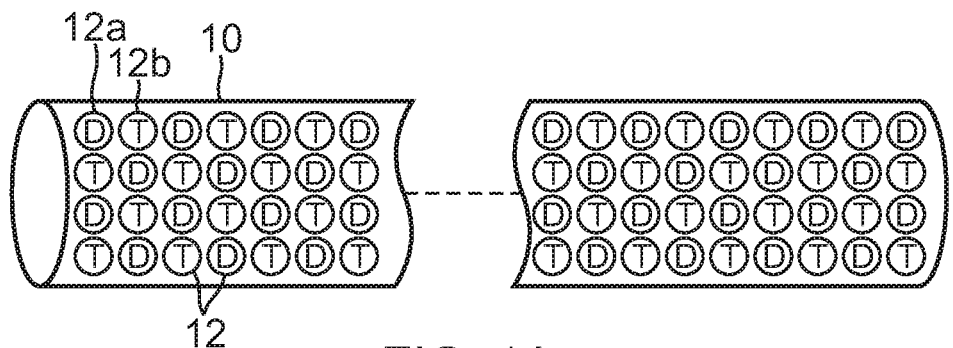
FIG. 1A is a schematic view of a bulb in accordance with one embodiment, showing a matrix arrangement of daylight and tungsten LEDs.

Turning now to FIG. 1A, a schematic diagram of LEDs are shown positioned in a matrix arrangement on a circuit board for use in a LED lamp or bulb in an embodiment of the present invention. There is a support structure 10 configured to receive and retain a plurality of LEDs 12 in a uniform and consistent position. The support structure 10 is preferably an elongated and narrow surface shaped to insert into a tubular transparent or diffusor shade such that the lamp construction is compatible with existing fixtures for traditional fluorescent lamp tubes. The LEDs 12 are positioned in a uniform and consistent directional position, and positioned in a matrix arrangement such that each LED is located equidistantly apart from surrounding LEDs 12. The support structure may be or may include a printed circuit board configured to connect a power source to the LEDs. The support structure 10 may be an aluminum housing with an elongate dome cover as the diffusor shade.

The preferred embodiment includes a first group of LEDs 12a (marked with D, for daylight white), and a second group of LEDs 12b (marked with T, for tungsten light), located on a surface of support structure 10. The D LEDs are configured to produce a light with color temperature in the range of 5400 to 5600 K (or about 5400 to 5600 K) for daylight white light. The T LEDs are configured to produce a light with color temperature in the range of 3050 to 3300 K (or about this range) and most preferably 3200 K or about 3200 K for warm white light. Additional ranges that may be acceptable are 2800 K to 3300 K and 5000 K to 5600 K, but the above are more preferred About means within 3 percent.

These ranges have been tested and used in numerous productions, and have been determined to be the preferred desired color temperature ranges for shooting television and film productions utilizing daylight and tungsten lighting to recreate day time and dusk/night time scenes.

In the embodiment as shown in FIG. 1A, the D and T LEDs may be arranged in an alternating checkerboard pattern to provide an even distribution of light on the subject. This arrangement is preferred to create an even lighting cast even when only one grouping of LEDs s being used at any given time. In the preferred embodiment, the circuit board of the LED lamp 8 (FIG. 2) is configured such that only one group of LEDs 12 can be turned on at a time. The D LEDs 12a and the T LEDs 12b are exclusively operated to produce either the daylight white lighting with the D bulbs, or the warm white lighting with the T bulbs. Since only one group of bulbs can be on at a single time, the arrangement of the two groups of LEDs may have a direct impact on the quality of the light produced by the LED lamp. Therefore, it may be advantageous to arrange the D and T bulbs in a consistently inter-dispersed matrix configuration as shown in FIG. 1A to produce the highest quality, evenly cast lighting.

Figure 1B:
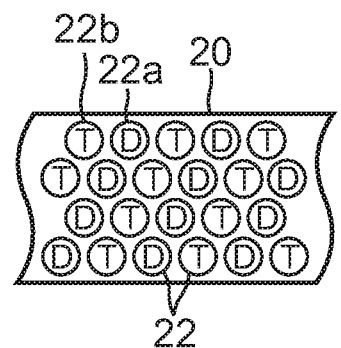
FIG. 1B is a schematic view of a bulb in accordance with another embodiment, showing a diagonally alternating arrangement of daylight and tungsten LEDs.
Figure 1C:
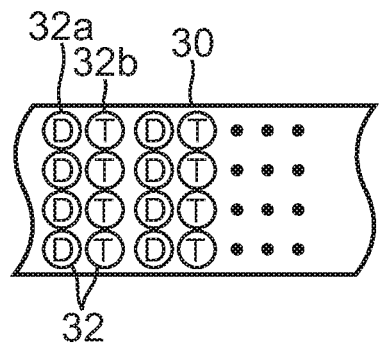
FIG. 1C is a schematic view of a bulb in accordance with an additional embodiment, showing an alternating arrangement of columns of daylight and tungsten LEDs.

In another embodiment, it may be desirable to create lighting effects with more directional light or harsher light wherein the LEDs of the D or T groups are not inter-dispersed, but positioned closer together within a single group. FIG. 1B shows an embodiment depicting LEDs 22 on support 20. D LEDs 22a and T LEDs 22b are in an alternate diagonally alternating arrangement of D and T LEDs, and FIG. 1C shows yet another embodiment depicting LEDs 32 on a support 30 having grouped alternating arrangement of columns of D and T LEDs 32a, 32b, respectively.

Figure 1D:
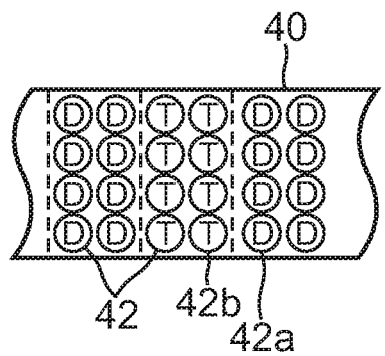
FIG. 1D is a schematic view of a bulb in accordance with a further embodiment, showing an alternating arrangement of groups of daylight and tungsten LEDs.

FIG. 1D shows a support 40 having LEDs 42 in alternating groups of columns of D LEDs 42a and T LEDs 42b. The LED arrangements are not limited to these embodiments and can vary based on the desired lighting effect for the particular use or scene being lit, but most preferably are individually alternating.

Figure 2:
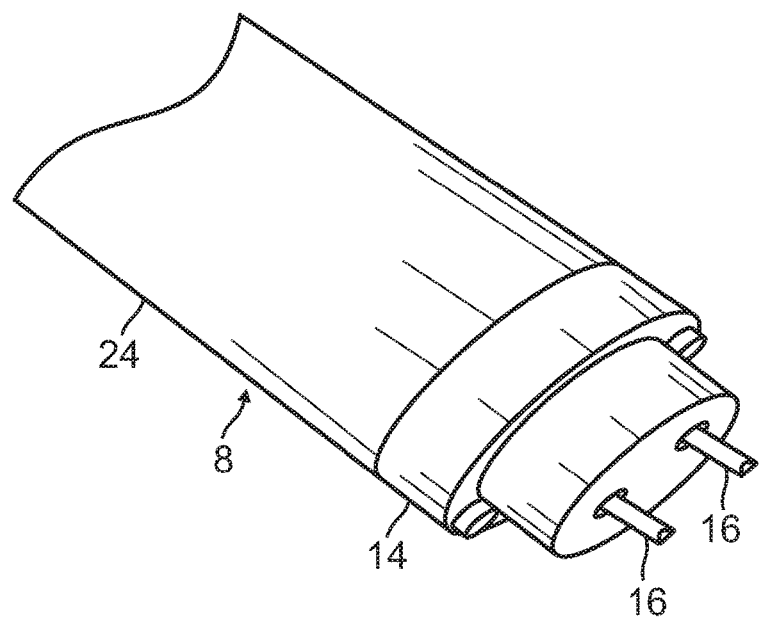
FIG. 2 is a perspective view of a portion of a bulb of the present invention.

FIG. 2 is a perspective view of a portion of LED lamp 8, which is similar to a traditional fluorescent lamp tube. Each end of the LED lamp 8 includes a base 14 which includes electrical connectors 16. This embodiment is configured with dimensions equivalent to a "T8" size traditional fluorescent tube, which is one inch in diameter, or a T12 size (one and a half inch diameter). The base 14 and connectors 16 are configured to be compatible with traditional fluorescent lighting fixtures and mounts such that the LED lamp 8 may be installed into existing lighting fixtures (such as shown in FIG. 4A).

A clear or semi-translucent or translucent diffusor shade tube 24 is also visible which acts to diffuse the light produced by the LEDs of the LED lamp. In the preferred embodiment, tube 24 is configured and sized with the same diameter as a traditional fluorescent tube lamp, such as a size T8 or T12. There may be various embodiments with varying tube diameters configured with the same diameter and dimensions of various other traditional fluorescent lamp sizes.

Figure 2A:
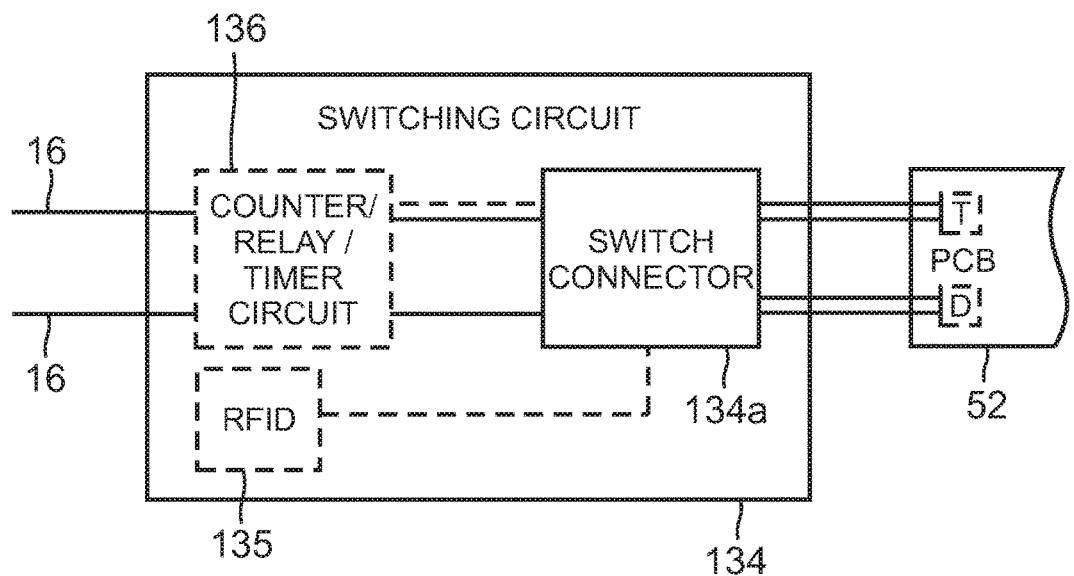
FIG. 2A is a schematic view of various alternative switching mechanisms in accordance with an embodiment of the present invention.

FIG. 2A is a schematic view of various alternative switching mechanisms in accordance with an embodiment of the present invention. Switching mechanism 134 shows various options for switch 34. It may be a manual switch such as manual switch 34a (see FIG. 4) or it may be a remote controlled switch having an RFID (radio frequency identification detector) 135 or infrared (IR) to receive remote controls to cause actual switch connector 134a to toggle between allowing current to drive the T LEDs or the D LEDs on circuit board 52 (PCB). Signals could also travel along the electrical connectors 16 by means of modulating an initial portion of the electrical power carried to connectors 16 (from, e.g., a control unit as in FIGS. 5 and 6). The modulated signal could be a certain pulsing of power on and power off in an initial period of turning on the switch to send power to the lamp, e.g., two pulses, for switching to the T LEDs and e.g., four pulses, for switching to the D LEDs. The switches on the control unit could be three way switches, enabling selection between D LEDs on, T bulbs on, and no light, or two way switches enabling selection between D LEDs on and T LEDs on, and using a master power switch to switch off the lamp. The control unit in this case would include circuitry to provide the modulated power on signal. When a counter/relay/timer circuit receives the pulses, it signals the switch connector 134a to move to the appropriate position to power the T LEDs or D LEDs. Alternatively, the control unit may send separate control signals along a multipin connector, and the LED lamp switching circuit may be a microprocessor or the like for receiving the signals and performing the switching function. In such a case, a standard fluorescent receiver and the leads into the bulb may be modified to send and receive appropriate control signals in addition to current.

Figure 3:
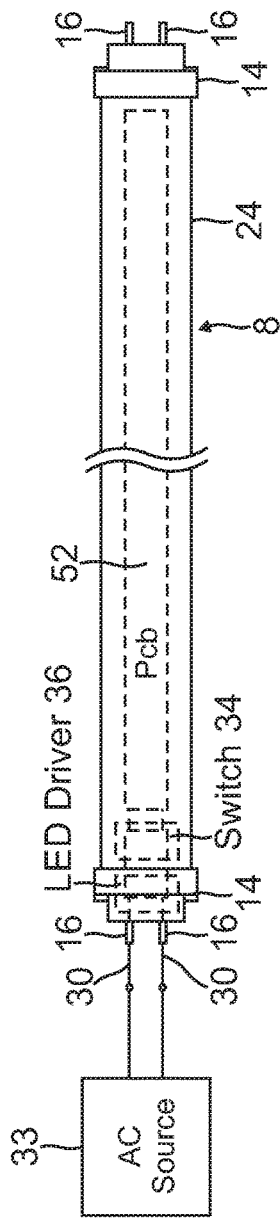
FIG. 3 is a schematic view of a bulb of the present invention.

FIG. 3 is a schematic view of an LED lamp of FIG. 2 in more detail. Representations of the LED lamp 8, base 20, connectors 16, and connector wires 30 are shown. An AC (or DC) power source 33 such as an electrical grid, battery, or generator may be connected to the connector wires to provide power to the LED lamp 8. This embodiment may also include at least one LED driver 36 configured to provide appropriate power input to the various LEDs of the first and second types, respectively, depending on and in response to a switch 34. LED lamp 8 may include two LED drivers 36, a first driver to provide appropriate power input to the D LEDs, and a second driver to provide appropriate power input to the T LEDs.

In another preferred embodiment, the driver or drivers 36 are configured to provide dimmable control over the LEDs of the LED lamp. The LED lamp 8 may include the power input switch 34 configured to selectively provide power to either the grouping of D LEDs or the grouping of T LEDs. Preferably, the grouping of LEDs to be powered at a given time by the power source may be selected by the user. Also preferably, each lamp or bulb 8 may have arrayed LEDs on each side of support 10 (or 20, 30 or 40).

Figure 4:
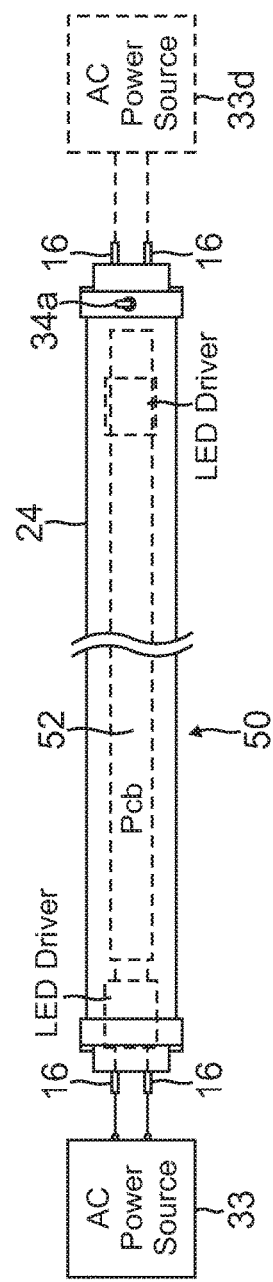
FIG. 4 is a schematic view of another embodiment of the present invention.
Figure 4A:
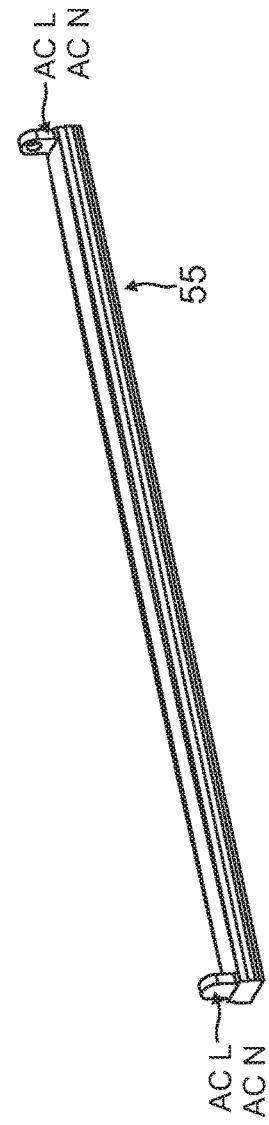
FIG. 4A is a view of a fluorescent bulb receptacle which may be used with a bulb of the present invention.

In an alternate embodiment as shown in FIG. 4, the LED lamp may include two sets of connectors 16, one set on each end of the LED lamp. One set of connectors may be electrically connected to provide power to one grouping of LED bulbs, and another to provide power to the other grouping. Each connector may be powered by distinct power sources. In another configuration, a power input switch 44 external to the LED lamp may be controllable by the user to selectively provide power to the desired grouping of LEDs. In an embodiment, the LED lighting system may include a wiring connector having at least sixteen pins, two of the pins being connected to the support structure to supply power to the first grouping of LEDs and the second grouping of LEDs. In the preferred embodiment, the LEDs are electrically connected to a power source by a printed circuit board (Pcb) 52.

As shown in FIG. 4A, there is a fluorescent bulb receptacle 55 in which bulb 8 may be placed to connect to a power source in the same manner as a fluorescent bulb would be placed therein.

In FIG. 4, there is an LED lamp 50 in an embodiment of the present invention. The lamp has multiple, e.g., four, LED lamps 57, 59, 61 and 63, each having LEDs in a matrix arrangement. LEDs 52 are positioned on a printed circuit board 54 (PCB) in a matrix arrangement. Two types of LEDs are utilized: there is a first group of LEDs configured to provide light with a color temperature between a predetermined range of 3050 and 3300 K, and a second group of LEDs configured to provide light between a predetermined range of 5400 to 5600 K. The two groups of LEDs are preferably arranged in an alternating matrix arrangement across the PCB as in FIG. 1A or may also be as in FIG. 1B, 1C or 1D. In an embodiment, the PCB is connected to sets of connectors on both ends of the PCB. In another embodiment, only one set of connectors is provided on one end of the PCB.

Each LED lamp 50 includes a clear, translucent or semi-translucent diffusor shade tube 24 configured to sleeve over the PCB and the LEDs. Preferably, the diffusor shade tube 24 is configured with the same size and dimensions as traditional fluorescent tube lamps, such as the T8 size (one inch diameter or if T12 then one and half inch diameter, etc.). The diffusor shade tube 24 may be constructed from glass or durable plastic with a white or neutral gray coloring so as to not affect the predetermined color temperature of the LED bulbs.

Figure 5:
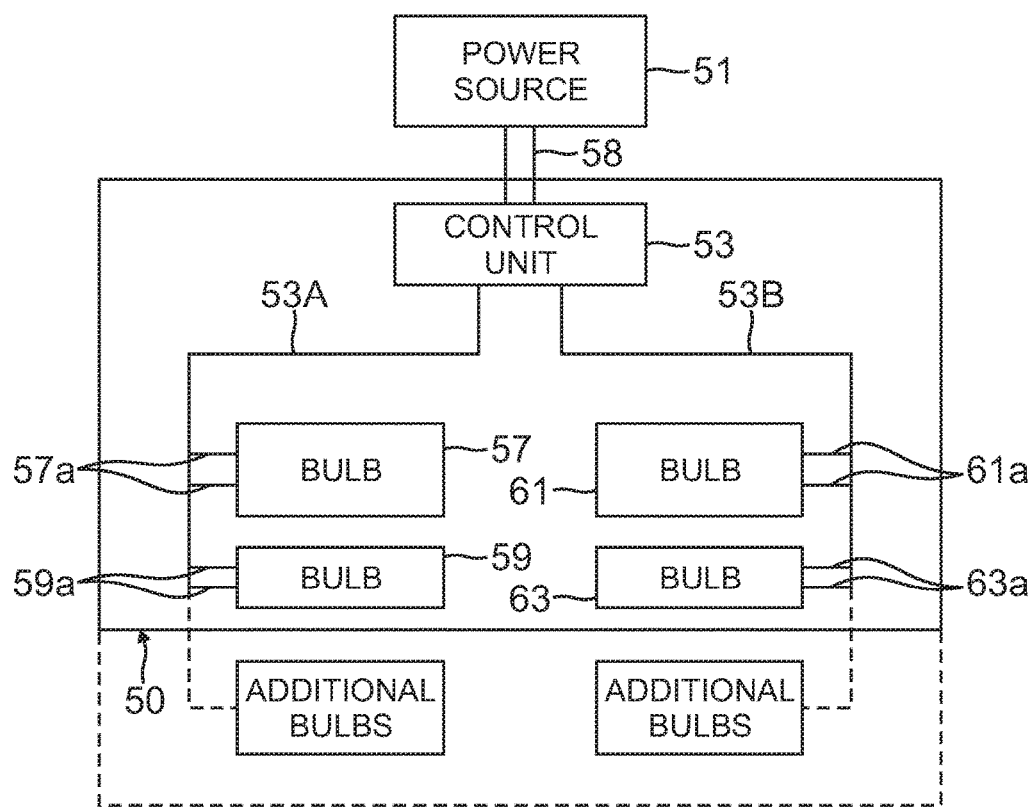
FIG. 5 is a schematic view of an LED lamp system in an embodiment of the present invention.

In FIG. 5, there is an LED lamp system 50 of the present invention. There is a power source 51 such as 110V AC current at 50 or 60 Hz. The power source is connected to control unit 53. From control unit 53, one or multiple cords or connectors 53A, 53B such as 16 pin connectors electrically connect the power source with the LED lamps 57, 59, 61, 63, such as if FIG. 3 or 4 with LED patterns such as in FIG. 1A or FIG. 1B, 1C or 1D. Specifically, the electrical wires in the connectors connect to leads 57a, 59a, 61a and 63a, respectively. Additional lamps may be connected as well, e.g. four per sixteen pin connector.

The drivers for each bulb could be connected to separate leads for each type of LED (D or T). More preferably, so that a fluorescent bulb receiver (e.g. receiver 55 of FIG. 4A) need not to be modified, the driver may include circuitry (e.g. a relay or series of relays or a counter or other controller) to toggle between the D LEDs and the T LEDs when the power is on. A simpler way is to have a switch, manual or remote control such as switch 34 or 34a of FIG. 3 that toggles between powering the D bulbs and the T bulbs. Lamp system 50 may be configured to be compatible or similar to traditional fluorescent tube lamp fixtures. Control unit 53 is controllable by the user to selectively provide power from power source 51 to a desired grouping of LED lamps or bulbs (57, 59 or 61, 63). In these embodiments, a manual switch (such as 34 or 34 or remote control or driver control) may be mounted on the support structure configured to enable selective operation of either the first type LEDs (D) or the second type LEDs (T).

Figure 6:
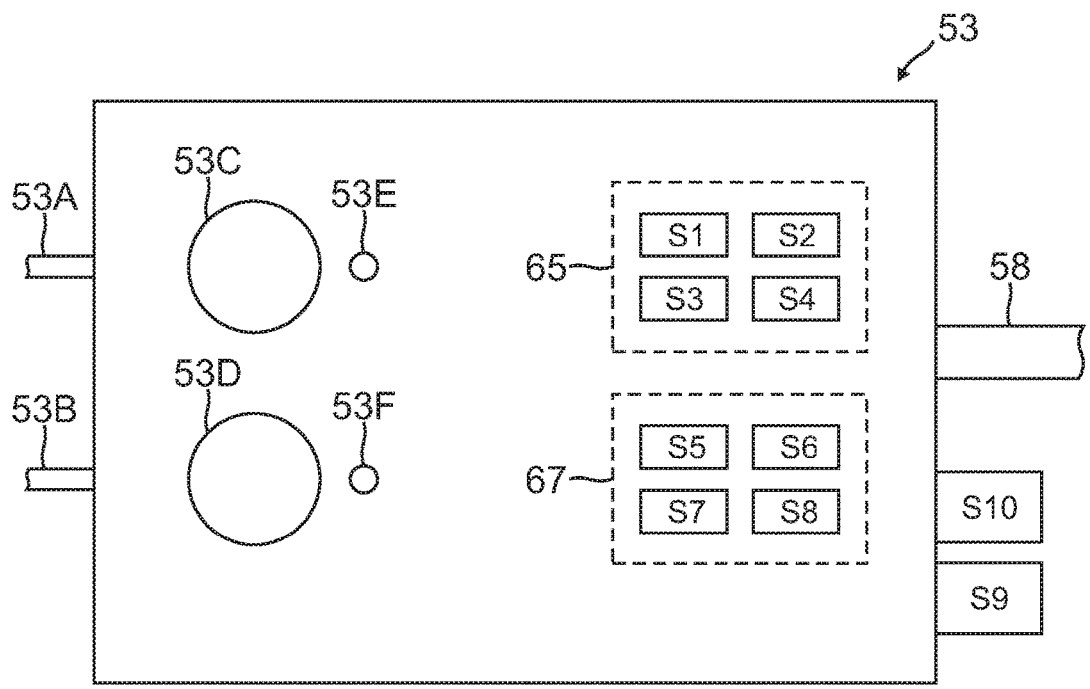
FIG. 6 is a perspective view of a control box of an embodiment of the present invention.

FIG. 6 is a schematic view of control unit 53 of the present invention. The control unit may include toggle switches S1 to S8 for controlling power input to the LED lamps 57, 59, 61, 63 and any additional bulbs (e.g., two more per each cable 53A, 53B) connected to the control unit. The control unit may be configured and connected such that each switch may control one or a predetermined grouping of LEDs for one specific LED lamp of the present invention, toggling between an "On" and "Off" position for that particular grouping of LED bulbs. Alternatively, each switch may control a plurality of the same LEDs grouping across a plurality of LED lamps in a bank of lights. For example, switch S1 may control the On/Off toggle of D color temperature LEDs for a bank of lights comprising two, four or more LED lamps, and switch S2 may control the On/Off toggle of T color temperature LEDs for the same two, or four or more LED lamps.

In another preferred embodiment, each switch (e.g. S1) may be configured to simply control the power switch of the LED lamp to selectively provide power to the D or T grouping of LEDs of the LED lamps. In this configuration, the user is unable to toggle between an On/Off power configuration to a particular LED lamp, but instead is able to simply control the specific grouping of LEDs being powered at any particular point in time. Additionally, control box 60 may include dimming switches 53C, 53D or knobs to control the power gain levels to the LED lamps to vary the brightness or LEDs and control lumens from the LED lamp. A power-on LED indicator 53E and 53F may be included for each bank of switches 65, 67, respectively. There may also be a master power switch S10 and another master power switch S9 for each switch bank 65, 67, respectively.

The control unit may be connected to the LED lamps via a standard quick connect interface. The quick connect interface may be connected to the LED lamps via industrial cables widely used in the lighting and commercial production industry.

Spectrophotocolorimeter testing for an LED lamp of the present invention, maps color perception in terms of two parameters, x and y. The chromaticity coordinates map the color with respect to hue and saturation on the two-dimensional Commission Internationale de l'Eclairage (CIE) diagram. The testing of Daylight indicates that a light color temperature of 5000 K. The color rendering index (CRI) is indicated as Ra which has been found to be at least about 92 to 93 percent.

A CIE test of tungsten had a light color temperature of about 2800 K to about 3000 K. The color rendering index is indicated as Ra being at least about 93 percent. Flux has been found to be about or over 1000 lumens.

Light systems of the present invention are suitable for TV or studio production.

Figure 7:
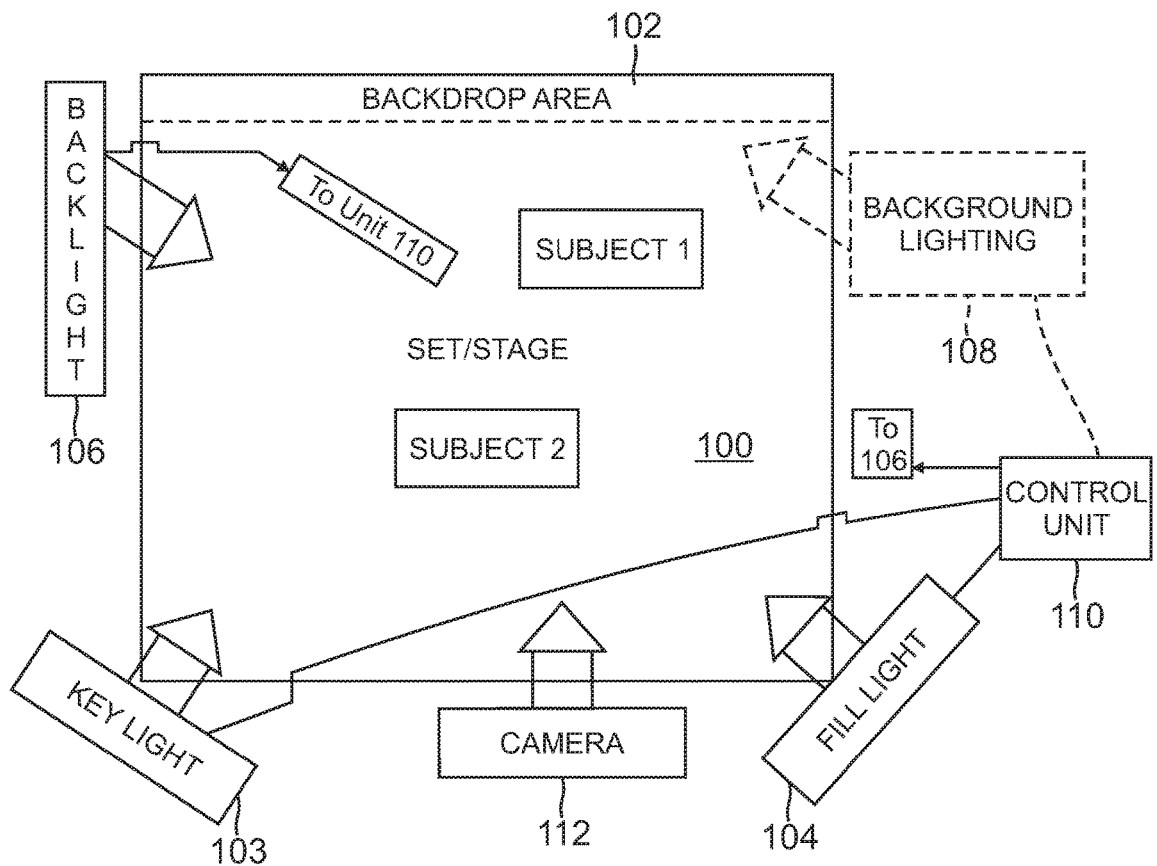
FIG. 7 is a schematic view of a stage and various LED lamps used for lighting a set in an embodiment of the present invention.

FIG. 7 is a diagram of the system of the present invention being used for a commercial production. The diagram depicts a scene being shot for commercial uses inside of a large studio or production warehouse. There is a set or stage 100, subjects 1 and 2 on stage (people), and a backdrop are 102. A plurality of LED fixtures 103, 104, 106 and 108 are provided and mounted to direct desired lighting on the stage or set of the production. Each LED fixture 90 may include a plurality of LED lamps, as in prior embodiments, e.g., a bank of four T8 or T12 size bulbs or other desirable size. Each group is configured to provide lighting within a predetermined color temperature range. In the diagram, the lighting provided by the LED lamps are selectively daylight white, with a color temperature between the range of 5400 to 5600 K, and tungsten or warm white with a color temperature range of 3000 to 3300 K, using control unit (or units) 110, which may be the same as shown in FIGS. 5 and 6. Other temperature ranges as disclosed herein may be used.

Each of the LED lamps are connected to control unit 110 via cables. The cables may be standard cables and wiring widely used in the lighting and commercial production industry. The cables may range from 50 to 100 feet in length, and may be extended to lengths of up to 200 feet, depending on production requirements. In many cases, the standard cables and wiring may be preexisting cables previously used with traditional fluorescent or halogen studio lighting. The compatibility of the LED lamps and fixtures of the present invention allow for use with traditional infrastructure and cables already in place. The cables may be connected to the control unit via a quick connect interface, which may include a secure screw-in connection. The quick connect interface may also be a standard connection interface widely used in the industry with traditional lighting equipment, which may be reused with the current invention. The control unit is connected via a quick connect interface to a power source, such as a power grid, generator, or large capacity battery, as in prior embodiments.

In the diagram, subjects S1 and S2 are being filmed on a film camera 112 during a scene. To recreate daylight lighting, control unit 110 is used to turn on power to only the daylight white LED bulbs of the LED lamps, which produces daylight white light with color temperature in the predetermined range of 5400 to 5600 K. The light is directed to hit the subject(s) and bounce off to give a predetermined color temperature based on the subjects' skin tone, which is then captured by the camera 112, giving the desired appearance and effect on film.

EXAMPLES

Example 1

A four foot long T12 (1.5" diameter) LED lamp was constructed with four rows of alternating LEDs of a daylight type and tungsten (warm light) type, using the pattern of FIG. 1A. The power consumption is quite low for the light output.

| | |
|---|---|
| Color Temperature (Daylight Mode) | 5500K ± 100° K |
| Color Temperature (Tungsten Mode) | 3200K ± 150° K |
| CRI (color rendering index) | 90%+ |
| Photo Color Correction (CC) Green | <5 G |
| Photo Color Correction (CC) Magenta | <5 M |
| Luminosity Daylight avg Lux/FC | 3 ft: 549/51 |
| | 5 ft: 289/27 |
| | 10 ft: 80/7.4 |
| | 15 ft: 40/3.7 |
| Luminosity Tungsten avg Lux/FC | 3 ft: 530/49 |
| | 5 ft: 230/21 |
| | 10 ft: 66/6 |
| | 15 ft: 30/2.8 |
| Power Consumption (@120 V/60 Hz) | 0.35 amp 42 watts |

Fluorescent lights range from a CRI (color rendering index) of about 50% for the basic types, up to about 90% for the best tri-phosphor type. The present invention can achieve a CRI as high or higher than expensive fluorescent lights.

Spacing of the LEDs may, e.g., be one quarter inch apart or about one quarter inch apart from the middle of one LED to the middle of the next one. It can be less and can be more as desired. For example, in a T12 bulb that is four feet long (1198 mm without the leads and 1213 mm with leads; by diameter of 41 mm), there would be four LEDs over the width and 144 LEDs long, for a total of 576 LEDs. Some of the four foot length of the bulb is taken up by the leads and end caps, driver and switch. The LEDs are preferably SMD 3528 (and/or SMD 2835 may be used or other suitable size) single color LEDs. Such LEDs may be about 3.5 mm by 2.8 mm, or very roughly about a ⅛ inch square.

Example 2

A four foot long T12 (1.5" diameter) LED lamp was constructed with four rows of alternating LEDs of a daylight type and tungsten (warm light) type, using the pattern of FIG. 1A. The power consumption is quite low for the light output. Other parameters are the same or substantially the same as in Example 1.

| | |
|---|---|
| Color Temperature (Day white Mode) | 5000 to 5500K |
| Color Temperature (Warm white Mode) | 2700-3200K |
| CRI (color rendering index) | >91 |
| Photo Color Correction (CC) Green | <5 G |
| Photo Color Correction (CC) Magenta | <5 M |
| Luminosity Daylight (day white) avg | 1170 ± 10% |
| Luminosity Tungsten (warm white) avg | 1010 ± 10% |
| Power Consumption (@110 V) | 20 watts each color |
| Type | Dimmable |
| Control | Selectable between warm white and day white |

At one foot the output can be over 1000 lumens, and therefore the light is suitable for stage uses. Therefore, with the same number of light bulbs as high quality fluorescent light to light a stage or set, which bulbs must be changed out for different scenes when different colors are required, use of the bulbs in accordance with the present invention achieves suitable light for the stage or set without having to change any bulbs, whether a scene is to be shot at warm white light or at daylight white.

Therefore, a method of a preferred embodiment of the invention, would be to light a stage or set to be filmed or photographed with a set of bulbs in accordance with the invention, and continue to light the stage or set with the same set of bulbs, selectively switching the bulbs between warm white light and daylight white for different scenes and/or different parts of scenes.

Example 3

A four foot long T12 (1.5" diameter) LED lamp was constructed with four rows of alternating LEDs of a daylight type and tungsten (warm light) type, using the pattern of FIG. 1A. The power consumption is quite low for the light output. Other parameters are the same or substantially the same as in Example 1.

| | |
|---|---|
| Color Temperature (Day white Mode) | 5000 to 5500K |
| Color Temperature (Warm white Mode) | 2800 to 3200K |
| CRI (color rendering index) | >92 |
| Photo Color Correction (CC) Green | <5 G |
| Photo Color Correction (CC) Magenta | <5 M |
| Luminosity Daylight (day white) avg | 1200 lumens ± 10% |
| Luminosity Tungsten (warm white) avg | 1050 lumens ± 10% |
| Power Consumption (@110 V) | 20 watts each color |
| Type | Dimmable |
| Control | Selectable between warm white and day white |

Again, luminosity is at least 1000 lumens. Lifespan in Examples 1, 2 and 3 is estimated at 40,000 hours.

To create the LED lamps, in each of the above examples, LEDs in the desired color ranges are selected which provide at least about 1000 lumens. The LEDs are tested to provide the desired light, e.g., with CRI of at least about 90 percent or more, flux of at least about 1000 lumens or more, and purity of color. Preferably, purity of light includes no more than about three percent green, no more than about three percent yellow and no more than about three percent magenta tones. In addition, the LEDs for the T (warm white light) type are selected in the ranges of 2800 to 3300 K or about 2800 to 3300 K, and more preferably 3050 to 3300 K or about 3050 to 3300 K, and the D (daylight white light) type are selected to be 5000 to 5800 K or about 5000 to 5800 K, and more preferably 5000 to 5500 K or about 5000 to 5500 K and most preferably 5200 to 5400 K or about 5200 to 5400 K. Alternatively, they may be selected in other ranges disclosed herein.

Figure 8:
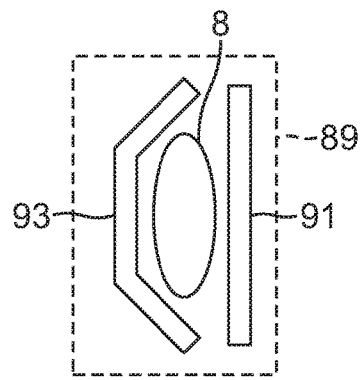
FIG. 8 is a schematic view of an LED lamp with a reflector and a light diffuser in accordance with an embodiment of the present invention.

FIG. 8 is a schematic view of an LED lamp 89 which may be used in the embodiment of FIG. 7. The lamp has a reflector 93 and a light diffuser 91 or gel in accordance with an embodiment of the present invention.

Although the invention has been described using specific terms, devices, and/or methods, such description is for illustrative purposes of the preferred embodiment(s) only. Changes may be made to the preferred embodiment(s) by those of ordinary skill in the art without departing from the scope of the present invention, which is set forth in the following claims. In addition, it should be understood that aspects of the preferred embodiment(s) generally may be interchanged in whole or in part.

What is claimed is:

1. An LED light system configured for providing broad-spectrum white light suitable for a commercial image recording in a form factor of a fluorescent tube, the LED light system comprising:
   a housing having ends and including a support structure in a form of an elongated and narrow surface and having a top side and a bottom side;
   a plurality of first LEDs mounted on the top side of the support structure and configured to emit broad-spectrum white light in a first predetermined Kelvin temperature range of cool white light;
   a plurality of second LEDs mounted on the top side of the support structure and configured to emit broad-spectrum white light in a second predetermined Kelvin temperature range of warm white light;
   circuitry mounted to the support structure including an LED driver circuit configured for selectively electronically switching between driving (i) the first LEDs to provide light while the second LEDs are off and (ii) the second LEDs to provide light while the first LEDs are off, wherein the first and second temperature ranges are nonoverlapping, and including a printed circuit board mounted to the support structure for carrying electrical power from a connection to the LED driver circuit and then to the first and second LEDs;
   an elongate cover extending substantially a length of the support structure and covering the top side of the support structure for diffusing light emitted by the first and second LEDs; and
   wherein the housing and cover together have a linear form factor of a fluorescent tube light having a diameter of no greater than about one to one and a half inches, wherein the LED light system is configured for receiving input power to be provided to the LED light system to selectively light the first and second LEDs, and wherein the first and second LEDs are disposed in rows and distributed along the length of the top side of the support structure such that the first LEDs and the second LEDs, whichever are on, emit a substantially even light along the length of the top side of the support structure, wherein the light is diffused by the cover and is suitable for the commercial image recording both when the emitted light from the LED light system is in the first temperature range of cool white light and when the emitted light from the LED light system is in the second temperature range of warm white light.

2. The LED light system of claim 1, wherein the first LEDs are configured to emit light with a color temperature between 5000 K and 5800 K, the second LEDs are configured to emit light between 2800 K and 3300 K.

3. The LED light system of claim 1, wherein the first LEDs and the second LEDs are distributed in a checkerboard pattern on the support structure, the first LEDs and the second LEDs alternating at regular intervals along a first axis and along a second axis, the first axis and the second axis being perpendicular.

4. The LED light system of claim 1, wherein the housing comprises an aluminum housing.

5. The LED light system of claim 1, wherein the color rendering index of each of the first LEDs and each of the second LEDs is greater than 90.

6. The LED light system of claim 1, further comprising:
   a manual knob for selectively controlling the LED driver circuit.

7. The LED light system of claim 1, further comprising:
a. a control box electrically coupled to the support structure, the control box including:
   i. a first switch configured to turn the first LEDs and an additional plurality of first LEDs on and off;
   ii. a first dimming control configured to control power gain of the first LEDs and the additional first LEDs;
   iii. a second switch configured to turn the second LEDs and an additional plurality of second LEDs on and off; and
   iv. a second dimming control configured to control power gain of the second LEDs and the additional second LEDs.

8. An LED light system configured for providing broad-spectrum white light suitable for a commercial image recording, in a form factor of a fluorescent tube, the LED light system comprising:
   b. a housing having ends and including a support structure in a form of an elongated and narrow surface and having a top side and a bottom side;
   c. a plurality of first LEDs mounted on the top side of the support structure and configured to emit broad-spectrum white light in a first predetermined Kelvin temperature range of cool white light;
   d. a plurality of second LEDs mounted on the top side of the support structure and configured to emit broad-spectrum white light in a second predetermined Kelvin temperature range of warm white light;
   e. circuitry mounted to the support structure including an LED driver circuit configured for selectively electronically switching between driving either (i) the first LEDs to provide light while the second LEDs are off and (ii) the second LEDs to provide light while the first LEDs are off, wherein the first and second temperature ranges are nonoverlapping, and including a printed circuit board mounted to the support structure for carrying electrical power from a connection to the LED driver circuit and then to the first and second LEDs;
   f. an elongate cover extending substantially a length of the support structure and covering the top side of the support structure for diffusing light emitted by the first and second LEDs; and
   g. wherein the housing and cover together have a linear form factor of a fluorescent tube light having no greater than a length of four feet and a diameter of no greater than about one to one and a half inches, wherein the LED light system is configured for receiving input power to be provided to the LED light system to selectively light the first and second LEDs, and wherein the first and second LEDs are disposed in a plurality of rows and are equally distributed along the length of the top side of the support structure, whichever are on, evenly emit light along the length of the top side of the support structure, wherein the light is diffused by the cover and is suitable for the commercial image recording both when the emitted light from the LED light system is in the first temperature range of cool white light and when the emitted light from the LED light system is in the second temperature range of warm white light, wherein the light emitted from the first LEDs and the light emitted from the second LEDs are each broad-spectrum white light containing a color deviation of no more than five points of green, and wherein the color rendering index of each of the first LEDs and each of the second LEDs is greater than 90.

9. The LED light system of claim 8, wherein the LED light system is provided without a gel or filter.

10. The LED light system of claim 8, the first LEDs each being configured to emit light with a color temperature between 5000 K and 5800 K, and the second LEDs each being configured to emit light between 2800 K and 3300 K.

11. The LED light system of claim 8, wherein the light emitted from the LED light system is at least 1000 lux or at least 1000 lumens.

12. The LED light system of claim 1, wherein the light emitted from the LED light system is at least 1000 lux or at least 1000 lumens.

13. The LED light system of claim 1, wherein there is a controller in the support structure connected to the LED driver circuit for generating a plurality of output signals and outputting the output signals to the LED driver circuit in response to a predetermined setting.

14. The LED light system of claim 8, wherein there is a controller in the support structure connected to the LED driver circuit for generating a plurality of output signals and outputting the output signals to the LED driver circuit in response to a predetermined setting, and there is a step of controlling the LED driver circuit using the predetermined setting.

15. An LED light system configured for providing broad-spectrum white light suitable for a commercial image recording in a form factor of a fluorescent tube, the LED light system comprising:
   a. a support structure in a form of an elongated and narrow surface and having a base cap at each end and a top side and a bottom side;
   b. a plurality of first LEDs mounted on the top side of the support structure and configured to provide broad-spectrum white light within a first predetermined Kelvin temperature range;
   c. a plurality of second LEDs mounted on the top side of the support structure and configured to provide broad-spectrum white light within a second predetermined Kelvin temperature range;
   d. circuitry mounted in the support structure including an LED driver circuit and is configured for selectively electronically switching between driving the first LEDs to provide light within the first predetermined temperature range and the second LEDs to provide light within the second predetermined temperature range, wherein the first and second temperature ranges are nonoverlapping, and including a printed circuit board mounted to the support structure for carrying electrical power from a connection at the base cap to the LED driver circuit and then to the first and second LEDs;
   e. an elongate cover extending substantially a length of the support structure for diffusing light emitted by the first and second LEDs; and
   f. wherein the support structure and cover together have a form factor of a fluorescent tube light having no greater than a size T12 having a length of four feet and a diameter of no greater than about one to one and a half inches, wherein the LED light system is configured for receiving input power to be provided to the LED light system to selectively light the first and second LEDs, and wherein the first and second LEDs are disposed on the support structure with the first and second LEDs equally distributed along the length of the top side of the support structure and the first and second LEDs are disposed in rows along the length of the top side of the support structure such that the first LEDs and the second LEDs evenly emit light which is diffused by the cover and is suitable for the commercial image recording both when the emitted light from the LED light system is in the first temperature range and when the emitted light from the LED light system is in the second temperature range;

g. wherein the first plurality of LEDs comprises cool white LEDs, and the second plurality of LEDs comprises warm white LEDs; and h. wherein the light emitted from the first LEDs and the light emitted from the second LEDs are each white light containing a color deviation of no more than five points of green.

16. An LED light system configured for providing broad-spectrum white light suitable for a commercial image recording in a form factor of a fluorescent tube, the LED light system comprising:

(a) a housing including a support structure in a form of an elongated and narrow surface and having a top side and a bottom side;

(b) a plurality of first LEDs mounted on the top side of the support structure and configured to emit broad-spectrum white light within a first predetermined Kelvin temperature range of cool white light;

(c) a plurality of second LEDs mounted on the top side of the support structure and configured to emit broad-spectrum white light within a second predetermined Kelvin temperature range of warm white light;

(d) circuitry mounted to the support structure including an LED driver circuit and is configured for selectively electronically switching between driving either (i) the first LEDs to provide light within the first predetermined temperature range while the second LEDs are off and (ii) the second LEDs to provide light within the second predetermined temperature range while the first LEDs are off, wherein the first and second temperature ranges are nonoverlapping, and including a printed circuit board mounted to the support structure for carrying electrical power to the LED driver circuit and then to the first and second LEDs; and (e) wherein the support structure fits within a form factor of a fluorescent tube light having no greater than a size T12 having a length of four feet and a diameter of no greater than about one to one and a half inches, wherein the LED light system is configured for receiving input power to be provided to the LED light system to selectively light the first and second LEDs, and wherein the first and second LEDs in a plurality of rows and are equally distributed along the length of the top side of the support structure such that the first LEDs and the second LEDs, whichever are on, evenly emit light along the length of the top side of the support structure, which light is broad-spectrum white light suitable for the commercial image recording both when the emitted light from the LED light system is in the first temperature range of cool white light and when the emitted light from the LED light system is in the second temperature range of warm white light.

17. The LED light system of claim 15, wherein the color rendering index of each of the first LEDs and each of the second LEDs is greater than 90.

18. The LED light system of claim 15, wherein the light emitted from the first LEDs and the light emitted from the second LEDs are each white light containing a color deviation of no more than five points of green.

19. The LED light system of claim 16, wherein the light emitted from the first LEDs and the light emitted from the second LEDs are each white light containing a color deviation of no more than five points of green.

20. The LED light system of claim 1, wherein the first LEDs are configured to emit light with a color temperature of at least 5000 K and the second LEDs are configured to emit light of no more than 3300.

21. The LED light system of claim 1, wherein the LED driver is switchable between turning on the warm white LEDs when the cool white LEDs are off and turning on the cool white LEDs when the warm white LEDs are off.

22. The LED light system of claim 1, wherein the warm white light is tungsten white, and the cool white light is daylight white.

23. The LED light system of claim 1, wherein the linear form factor has a length of no greater than about four feet.

24. The LED light system of claim 1, wherein the linear form factor has a length of about four feet.

25. The LED light system of claim 1, wherein the light emitted from the first LEDs and the light emitted from the second LEDs are each broad-spectrum white light containing a color deviation of no more than five points of green, and wherein the color rendering index of each of the first LEDs and each of the second LEDs is greater than 90.

26. The LED light system of claim 1, wherein the light system has end caps at each end of the housing, and there is a switch on one of the end caps for controlling the LED driver to switch between the warm white LEDs and the cool white LEDs.

27. The LED light system of claim 1, wherein the first LEDs each being configured to emit light with a color temperature between 5000 K and 5800 K.

28. The LED light system of claim 1, wherein the second LEDs each being configured to emit light between 2800 K and 3300 K.

29. The LED light system of claim 27, wherein the second LEDs each being configured to emit light between 2800 K and 3300 K.

30. The LED light system of claim 2, wherein the housing comprises an aluminum housing.

31. The LED light system of claim 1, wherein the light system is configured to use twenty watts of power for selectively lighting the first set of LEDs and the second set of LEDs.

32. The LED light system of claim 31, wherein the housing comprises an aluminum housing.

33. The LED light system of claim 32, wherein the first LEDs each being configured to emit light with a color temperature between 5000 K and 5800 K.

34. The LED light system of claim 33, wherein the second LEDs each being configured to emit light between 2800 K and 3300 K.

35. The LED light system of claim 34, wherein the linear form factor has a length of about four feet.

36. The LED light system of claim 35, wherein the LED driver is switchable between turning on the warm white LEDs when the cool white LEDs are off and turning on the cool white LEDs when the warm white LEDs are off.

37. The LED light system of claim 36, wherein the light emitted from the first LEDs and the light emitted from the second LEDs are each broad-spectrum white light containing a color deviation of no more than five points of green, and wherein the color rendering index of each of the first LEDs and each of the second LEDs is greater than 90.

38. The LED light system of claim 37, wherein the light system has end caps at each end of the housing, and there is a switch on one of the end caps for controlling the LED driver to switch between the warm white LEDs and the cool white LEDs.

39. The LED light system of claim 38, wherein the first LEDs each being configured to emit light with a color temperature between 5000 K and 5800 K.

40. The LED light system of claim 39, wherein the second LEDs each being configured to emit light between 2800 K and 3300 K.

* * * * *

EX PARTE REEXAMINATION CERTIFICATE (11513th)
United States Patent
Macias

(10) Number: US 9,845,924 C1
(45) Certificate Issued: *May 7, 2019

(54) TUBE LIGHT WITH IMPROVED LED ARRAY

(71) Applicant: Guillermo Macias, Santa Clarita, CA (US)

(72) Inventor: Guillermo Macias, Santa Clarita, CA (US)

(73) Assignee: COLT INTERNATIONAL CLOTHING INC., Santa Clarita, CA (US)

Reexamination Request:
No. 90/014,150, Jun. 12, 2018

Reexamination Certificate for:
Patent No.: 9,845,924
Issued: Dec. 19, 2017
Appl. No.: 15/450,372
Filed: Mar. 6, 2017

(*) Notice: This patent is subject to a terminal disclaimer.

Related U.S. Application Data

(63) Continuation of application No. 13/896,868, filed on May 17, 2013, now Pat. No. 9,719,642.

(60) Provisional application No. 61/648,554, filed on May 17, 2012.

(51) Int. Cl.
*F21K 9/278* (2016.01)
*F21S 10/02* (2006.01)
*H05K 13/00* (2006.01)
*F21K 9/272* (2016.01)
*H05B 33/08* (2006.01)

(52) U.S. Cl.
CPC .............. *F21S 10/02* (2013.01); *H05K 13/00* (2013.01); *F21K 9/278* (2016.08)

(58) Field of Classification Search
CPC ........ F21S 10/02; F21S 10/023; H05K 13/00; F21K 9/272; F21K 9/278; F21V 3/02; F21V 23/04; H05B 33/0845; F21Y 2105/10; F21Y 2103/10; F21W 2131/406
USPC .................... 362/11, 231, 225, 219, 236, 230
See application file for complete search history.

(56) References Cited

To view the complete listing of prior art documents cited during the proceeding for Reexamination Control Number 90/014,150, please refer to the USPTO's public Patent Application Information Retrieval (PAIR) system under the Display References tab.

*Primary Examiner* — Henry N Tran

(57) ABSTRACT

Apparatus and system for producing light using LED lighting with output within a predetermined desired color temperature range for commercial lighting uses. A preferred embodiment includes a first and second group of LEDs arranged in an alternating matrix configuration, each group of LEDs configured to produce light in a predetermined color temperature range. In a preferred embodiment, an LED light system includes a tubular LED lamp having substantially the same size and dimensions as a traditional fluorescent lamp tube and a control box for controlling power input and power gain to the first, second, or both groups of LEDs.

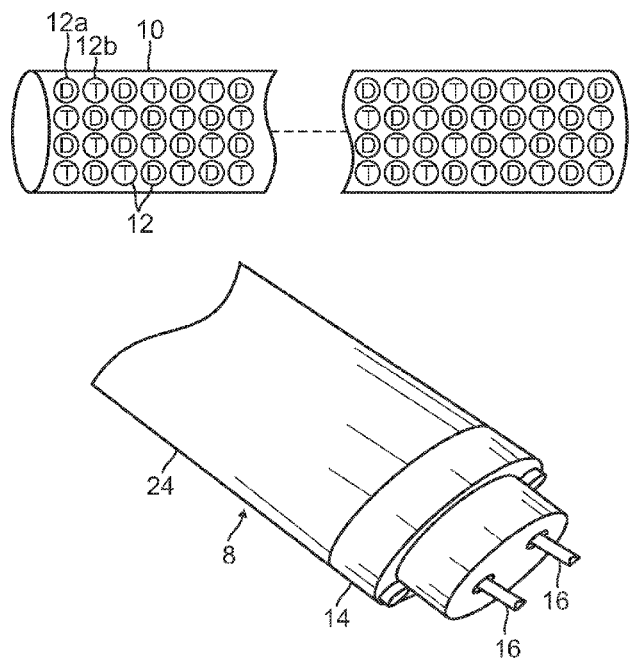

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 4, 5, 11, 17-19, 25, 31 and 37 are cancelled.

Claims 1, 8, 15, 16, 32 and 38 are determined to be patentable as amended.

Claims 2, 3, 6, 7, 9, 10, 12-14, 20-24, 26-30, 33-36, 39 and 40, dependent on an amended claim, are determined to be patentable.

New claims 41-49 are added and determined to be patentable.

1. An LED light system configured for providing broad-spectrum white light suitable for a commercial image recording in a form factor of a fluorescent tube, the LED light system comprising:
   (a) a housing having ends and including a support structure in a form of an elongated and narrow surface and having a top side and a bottom side;
   (b) a plurality of first LEDs mounted on the top side of the support structure and configured to emit broad-spectrum white light in a first predetermined Kelvin temperature range of cool white light;
   (c) a plurality of second LEDs mounted on the top side of the support structure and configured to emit broad-spectrum white light in a second predetermined Kelvin temperature range of warm white light;
   (d) circuitry mounted to the support structure including an LED driver circuit configured for selectively electronically switching between driving (i) the first LEDs *with at least twenty watts of power* to provide light while the second LEDs are off and (ii) the second LEDs *with at least twenty watts of power* to provide light while the first LEDs are off, wherein the first and second temperature ranges are nonoverlapping, and including a printed circuit board mounted to the support structure for carrying electrical power from a connection to the LED driver circuit and then to the first and second LEDs;
   (e) an elongate cover extending substantially a length of the support structure and covering the top side of the support structure for diffusing light emitted by the first and second LEDs; and
   (f) wherein the housing and cover together have a linear form factor of a fluorescent tube light having a diameter of no greater than about one to one and a half inches, wherein the LED light system is configured for receiving input power to be provided to the LED light system to selectively light the first and second LEDs, and wherein the first and second LEDs are disposed in rows and distributed along the length of the top side of the support structure such that the first LEDs and the second LEDs, whichever are on, emit a substantially even light along the length of the top side of the support structure, wherein the light is diffused by the cover and is suitable for the commercial image recording both when the emitted light from the LED light system is in the first temperature range of cool white light and when the emitted light from the LED light system is in the second temperature range of warm white light,
   (g) *wherein the light emitted from the first LEDs and the light emitted from the second LEDs are each broad-spectrum white light containing a color deviation of no more than five points of green, and wherein the color rendering index of each of the first LEDs and each of the second LEDs is greater than 90.*

8. An LED light system configured for providing broad-spectrum white light suitable for a commercial image recording, in a form factor of a fluorescent tube, the LED light system comprising:
   [b.](*a*) a housing having ends and including a support structure in a form of an elongated and narrow surface and having a top side and a bottom side;
   [c.] (*b*) a plurality of first LEDs mounted on the top side of the support structure and configured to emit broad-spectrum white light in a first predetermined Kelvin temperature range of cool white light;
   [d.] (*c*) a plurality of second LEDs mounted on the top side of the support structure and configured to emit broad-spectrum white light in a second predetermined Kelvin temperature range of warm white light;
   [e.] (*d*) circuitry mounted to the support structure including an LED driver circuit configured for selectively electronically switching between driving either (i) the first LEDs to provide light while the second LEDs are off and (ii) the second LEDs to provide light while the first LEDs are off, wherein the first and second temperature ranges are nonoverlapping, and including a printed circuit board mounted to the support structure for carrying electrical power from a connection to the LED driver circuit and then to the first and second LEDs;
   [f.] (*e*) an elongate cover extending substantially a length of the support structure and covering the top side of the support structure for diffusing light emitted by the first and second LEDs; and
   [g.] (*f*) wherein the housing and cover together have a linear form factor of a fluorescent tube light having no greater than a length of four feet and a diameter of no greater than about one to one and a half inches, wherein the LED light system is configured for receiving input power to be provided to the LED light system to selectively light the first and second LEDs, and wherein the first and second LEDs are disposed in a plurality of rows and are equally distributed along the length of the top side of the support structure, whichever are on, evenly emit light along the length of the top side of the support structure, wherein the light is diffused by the cover and is suitable for the commercial image recording both when the emitted light from the LED light system is in the first temperature range of cool white light and when the emitted light from the LED light system is in the second temperature range of warm white light, wherein the light emitted from the first LEDs and the light emitted from the second LEDs are each broad-spectrum white light containing a color deviation of no more than five points of green, and wherein the color rendering index of each of the first LEDs and each of the second LEDs is greater than 90, *and*
   (g) *wherein the light emitted from the LED light system is at least 1000 lux or at least 1000 lumens.*

15. An LED light system configured for providing broad-spectrum white light suitable for a commercial image recording in a form factor of a fluorescent tube, the LED light system comprising:
[a.] (a) a support structure in a form of an elongated and narrow surface and having a base cap at each end and a top side and a bottom side;
[b.] (b) a plurality of first LEDs mounted on the top side of the support structure and configured to provide broad-spectrum white light within a first predetermined Kelvin temperature range;
[c.] (c) a plurality of second LEDs mounted on the top side of the support structure and configured to provide broad-spectrum white light within a second predetermined Kelvin temperature range;
[d.] (d) circuitry mounted in the support structure including an LED driver circuit and is configured for selectively electronically switching between driving the first LEDs to provide light within the first predetermined temperature range and the second LEDs to provide light within the second predetermined temperature range, wherein the first and second temperature ranges are nonoverlapping, and including a printed circuit board mounted to the support structure for carrying electrical power from a connection at the base cap to the LED driver circuit and then to the first and second LEDs;
[f.] (f) an elongate cover extending substantially a length of the support structure for diffusing light emitted by the first and second LEDs; and
[g.] (g) wherein the support structure and cover together have a form factor of a fluorescent tube light having no greater than a size T12 having a length of four feet and a diameter of no greater than about one to one and a half inches, wherein the LED light system is configured for receiving input power to be provided to the LED light system to selectively light the first and second LEDs, and wherein the first and second LEDs are disposed on the support structure with the first and second LEDs equally distributed along the length of the top side of the support structure and the first and second LEDs are disposed in rows along the length of the top side of the support structure such that the first LEDs and the second LEDs evenly emit light which is diffused by the cover and is suitable for the commercial image recording both when the emitted light from the LED light system is in the first temperature range and when the emitted light from the LED light system is in the second temperature range;
[h.] (h) wherein the first plurality of LEDs comprises cool white LEDs, and the second plurality of LEDs comprises warm white LEDs; and
[i.] (i) wherein the light emitted from the first LEDs and the light emitted from the second LEDs are each white light containing a color deviation of no more than five points of green; and
(j) wherein the color rendering index of each of the first LEDs and each of the second LEDs is greater than 90.

16. An LED light system configured for providing broad-spectrum white light suitable for a commercial image recording in a form factor of a fluorescent tube, the LED light system comprising:
(a) a housing including a support structure in a form of an elongated and narrow surface and having a top side and a bottom side;
(b) a plurality of first LEDs mounted on the top side of the support structure and configured to emit broad-spectrum white light within a first predetermined Kelvin temperature range of cool white light;
(c) a plurality of second LEDs mounted on the top side of the support structure and configured to emit broad-spectrum white light within a second predetermined Kelvin temperature range of warm white light;
(d) circuitry mounted to the support structure including an LED driver circuit and is configured for selectively electronically switching between driving either (i) the first LEDs *with at least twenty watts of power* to provide light within the first predetermined temperature range while the second LEDs are off and (ii) the second LEDs *with at least twenty watts of power* to provide light within the second predetermined temperature range while the first LEDs are off, wherein the first and second temperature ranges are nonoverlapping, and including a printed circuit board mounted to the support structure for carrying electrical power to the LED driver circuit and then to the first and second LEDs; and
(e) wherein the support structure fits within a form factor of a fluorescent tube light having no greater than a size T12 having a length of four feet and a diameter of no greater than about one to one and a half inches, wherein the LED light system is configured for receiving input power to be provided to the LED light system to selectively light the first and second LEDs, and wherein the first and second LEDs in a plurality of rows and are equally distributed along the length of the top side of the support structure such that the first LEDs and the second LEDs, whichever are on, evenly emit light along the length of the top side of the support structure, which light is broad-spectrum white light suitable for the commercial image recording both when the emitted light from the LED light system is in the first temperature range of cool white light and when the emitted light from the LED light system is in the second temperature range of warm white light;
(f) *wherein the light emitted from the first LEDs and the light emitted from the second LEDs are each broad-spectrum white light containing a color deviation of no more than five points of green, and wherein the color rendering index of each of the first LEDs and each of the second LEDs is greater than 90.*

32. The LED light system of claim [31] *1*, wherein the housing comprises an aluminum housing.

38. The LED light system of claim [37] *36*, wherein the light system has end caps at each end of the housing, and there is a switch on one of the end caps for controlling the LED driver to switch between the warm white LEDs and the cool white LEDs.

*41. The LED light system of claim 8, wherein the LED driver circuit is configured for selectively electronically switching between driving (i) the first LEDs with at least twenty watts of power to provide light while the second LEDs are off and (ii) the second LEDs with at least twenty watts of power to provide light while the first LEDs are off.*

*42. The LED light system of claim 16, wherein the LED driver circuit is configured for selectively electronically switching between driving (i) the first LEDs with at least twenty watts of power to provide light while the second LEDs are off and (ii) the second LEDs with at least twenty watts of power to provide light while the first LEDs are off.*

*43. The LED light system of claim 1, wherein the light system has a toggle switch at one end of the housing to switch between the warm white LEDs and the cool white LEDs.*

44. The LED light system of claim 8, wherein the light system has a toggle switch at one end of the housing to switch between the warm white LEDs and the cool white LEDs.

45. The LED light system of claim 12, wherein the light system has a toggle switch at one end of the housing to switch between the warm white LEDs and the cool white LEDs.

46. The LED light system of claim 15, wherein the light system has a toggle switch at one end of the housing to switch between the warm white LEDs and the cool white LEDs.

47. The LED light system of claim 16, wherein the light system has a toggle switch at one end of the housing to switch between the warm white LEDs and the cool white LEDs.

48. The LED light system of claim 41, wherein the light system has a toggle switch at one end of the housing to switch between the warm white LEDs and the cool white LEDs.

49. The LED light system of claim 42, wherein the light system has a toggle switch at one end of the housing to switch between the warm white LEDs and the cool white LEDs.

\* \* \* \* \*

(12) EX PARTE REEXAMINATION CERTIFICATE (11900th)
United States Patent
Macias

(10) Number: US 9,845,924 C2
(45) Certificate Issued: *Aug. 19, 2021

(54) TUBE LIGHT WITH IMPROVED LED ARRAY

(71) Applicant: Guillermo Macias, Santa Clarita, CA (US)

(72) Inventor: Guillermo Macias, Santa Clarita, CA (US)

(73) Assignee: COLT INTERNATIONAL CLOTHING INC.

Reexamination Request:
No. 90/014,372, Sep. 4, 2019

Reexamination Certificate for:
Patent No.: 9,845,924
Issued: Dec. 19, 2017
Appl. No.: 15/450,372
Filed: Mar. 6, 2017

Reexamination Certificate C1 9,845,924 issued May 7, 2019

( * ) Notice: This patent is subject to a terminal disclaimer.

Related U.S. Application Data

(63) Continuation of application No. 13/896,868, filed on May 17, 2013, now Pat. No. 9,719,642.

(60) Provisional application No. 61/648,554, filed on May 17, 2012.

(51) Int. Cl.
*F21K 9/272* (2016.01)

(52) U.S. Cl.
CPC .................................. *F21K 9/272* (2016.08)

(58) Field of Classification Search
None
See application file for complete search history.

(56) References Cited

To view the complete listing of prior art documents cited during the proceeding for Reexamination Control Number 90/014,372, please refer to the USPTO's public Patent Application Information Retrieval (PAIR) system under the Display References tab.

*Primary Examiner* — Fred O Ferris, III

(57) ABSTRACT

Apparatus and system for producing light using LED lighting with output within a predetermined desired color temperature range for commercial lighting uses. A preferred embodiment includes a first and second group of LEDs arranged in an alternating matrix configuration, each group of LEDs configured to produce light in a predetermined color temperature range. In a preferred embodiment, an LED light system includes a tubular LED lamp having substantially the same size and dimensions as a traditional fluorescent lamp tube and a control box for controlling power input and power gain to the first, second, or both groups of LEDs.

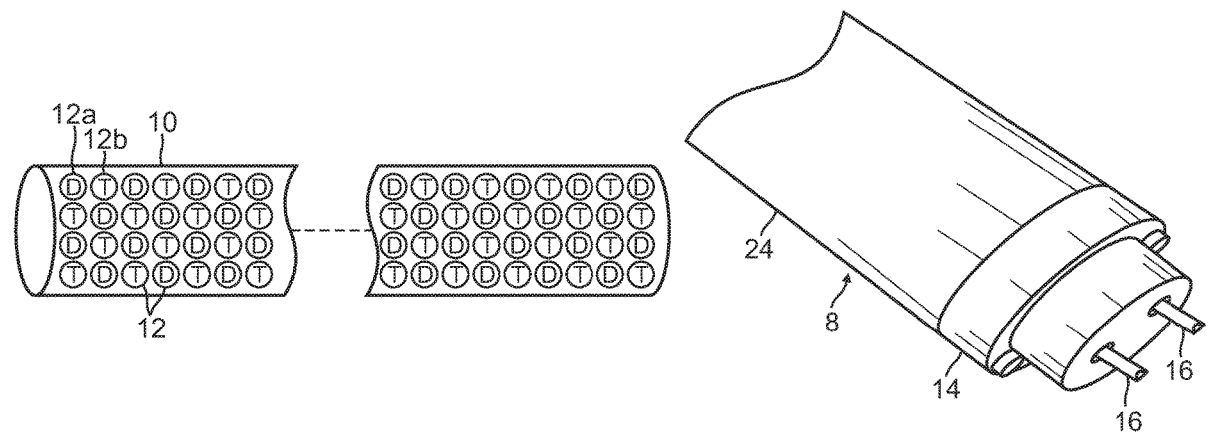

EX PARTE REEXAMINATION CERTIFICATE

NO AMENDMENTS HAVE BEEN MADE TO THE PATENT

AS A RESULT OF REEXAMINATION, IT HAS BEEN DETERMINED THAT:

The patentability of claims 1-3, 6-10, 12-16, 20-24, 26-30, 32-36 and 38-49 is confirmed.

Claims 4, 5, 11, 17-19, 25, 31 and 37 were previously cancelled.

\* \* \* \* \*